(12) United States Patent
Mulkens et al.

(10) Patent No.: US 7,763,355 B2
(45) Date of Patent: Jul. 27, 2010

(54) DEVICE MANUFACTURING METHOD, TOP COAT MATERIAL AND SUBSTRATE

(75) Inventors: Johannes Catharinus Hubertus Mulkens, Waalre (NL); Marcel Mathijs Theodore Marie Dierichs, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/292,031

(22) Filed: Nov. 10, 2008

(65) Prior Publication Data

US 2009/0075061 A1 Mar. 19, 2009

Related U.S. Application Data

(62) Division of application No. 11/022,935, filed on Dec. 28, 2004, now Pat. No. 7,491,661.

(51) Int. Cl.
*B32B 9/04* (2006.01)
*B32B 5/16* (2006.01)
*G03C 1/00* (2006.01)
*G03C 7/00* (2006.01)

(52) U.S. Cl. ............... 428/411.1; 428/323; 430/270.1; 430/271.1; 430/273.1; 977/773; 977/778; 977/779

(58) Field of Classification Search .................. None
See application file for complete search history.

(56) References Cited

U.S. PATENT DOCUMENTS

| | | | |
|---|---|---|---|
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,121,256 A | 6/1992 | Corle et al. | |
| 5,610,683 A | 3/1997 | Takahashi | |
| 5,825,043 A | 10/1998 | Suwa | |
| 5,900,354 A | 5/1999 | Batchelder | |
| 6,191,429 B1 | 2/2001 | Suwa | |
| 6,236,634 B1 | 5/2001 | Lee et al. | |
| 6,600,547 B2 | 7/2003 | Watson et al. | |
| 6,603,130 B1 | 8/2003 | Bisschops et al. | |
| 2002/0020821 A1 | 2/2002 | Van Santen et al. | |
| 2002/0163629 A1 | 11/2002 | Switkes et al. | |
| 2003/0123040 A1 | 7/2003 | Almogy | |
| 2004/0000627 A1 | 1/2004 | Schuster | |
| 2004/0075895 A1 | 4/2004 | Lin | |
| 2004/0114117 A1 | 6/2004 | Bleeker | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2004/0239954 A1 | 12/2004 | Bischoff | |
| 2004/0263809 A1 | 12/2004 | Nakano | |
| 2005/0007569 A1 | 1/2005 | Streefkerk et al. | |
| 2005/0018155 A1 | 1/2005 | Cox et al. | |
| 2005/0024609 A1 | 2/2005 | De Smit et al. | |
| 2005/0030497 A1 | 2/2005 | Nakamura | |
| 2005/0036184 A1 | 2/2005 | Yeo et al. | |
| 2005/0042554 A1 | 2/2005 | Diericks et al. | |
| 2005/0046813 A1 | 3/2005 | Streefkerk et al. | |
| 2005/0046934 A1 | 3/2005 | Ho et al. | |
| 2005/0052632 A1 | 3/2005 | Miyajima | |
| 2005/0094116 A1 | 5/2005 | Flagello et al. | |
| 2005/0094125 A1 | 5/2005 | Arai | |
| 2005/0122505 A1 | 6/2005 | Miyajima | |
| 2005/0132914 A1 | 6/2005 | Mulkens et al. | |
| 2005/0134817 A1 | 6/2005 | Nakamura | |
| 2005/0140948 A1 | 6/2005 | Tokita | |
| 2005/0146693 A1 | 7/2005 | Ohsaki | |
| 2005/0146694 A1 | 7/2005 | Tokita | |
| 2005/0151942 A1 | 7/2005 | Kawashima | |
| 2005/0200815 A1 | 9/2005 | Akamatsu | |
| 2005/0213065 A1 | 9/2005 | Kitaoka | |
| 2005/0213066 A1 | 9/2005 | Sumiyoshi | |
| 2005/0219489 A1 | 10/2005 | Nei et al. | |
| 2005/0233081 A1 | 10/2005 | Tokita | |

FOREIGN PATENT DOCUMENTS

| | | |
|---|---|---|
| DE | 206 607 | 2/1984 |
| DE | 221 563 | 4/1985 |
| DE | 224 448 | 7/1985 |

(Continued)

OTHER PUBLICATIONS

English Translation of Japanese Official Action issued on Dec. 12, 2008 in Japanese Application No. 2005-374780.

(Continued)

*Primary Examiner*—Sheeba Ahmed
(74) *Attorney, Agent, or Firm*—Pillsbury Winthrop Shaw Pittman LLP

(57) ABSTRACT

In immersion lithography, to avoid internal reflections in the final element of the projection system, immersion fluid and topcoat, the thicknesses, $d_f$, $d_{tc}$, and $d_r$, and refractive indices, $n_f$, $n_{tc}$ and $n_r$, of the immersion fluid, topcoat and resist may meet the following criteria:

$$n_f \leq n_{tc} \leq n_r.$$

$$d_f > \sim 5 \lambda$$

$$d_{tc} \leq \sim 5 \lambda.$$

19 Claims, 4 Drawing Sheets

FOREIGN PATENT DOCUMENTS

| | | |
|---|---|---|
| DE | 242 880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2002-169269 A | 6/2002 |
| JP | 2004-193252 | 7/2004 |
| WO | WO 99/49504 | 9/1999 |
| WO | 00/06495 A1 | 2/2000 |
| WO | 00/06622 A1 | 2/2000 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | 2004/112108 A1 | 12/2004 |
| WO | WO 2005/010611 | 2/2005 |
| WO | WO 2005/024517 | 3/2005 |
| WO | 2005/088397 A2 | 9/2005 |
| WO | 2005/114711 A1 | 12/2005 |

OTHER PUBLICATIONS

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

DEVICE MANUFACTURING METHOD, TOP COAT MATERIAL AND SUBSTRATE

The present application is a divisional of U.S. patent application Ser. No. 11/022,935, filed Dec. 28, 2004 now U.S. Pat. No. 7,491,661, now allowed, the entire contents of the foregoing application herein fully incorporated by reference.

FIELD

The present invention relates to a method for manufacturing a device, a topcoat material and a substrate provided with a topcoat.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Various different materials have been proposed for use as the immersion liquid, i.e. the liquid that fills a space between the projection system and the substrate, such as ultra-pure water. Ultra-pure water interacts chemically with resists used in "dry" lithography thus leading to the development of new resists for immersion lithography and/or the use of a so-called topcoat between the resist and the immersion liquid.

SUMMARY

Besides water, other liquids with higher refractive indexes, e.g. >1.6, may be used in immersion lithography, including sulfuric acid and suspensions of nano-particles, e.g. of $Al_2O_3$.

Accordingly, it would advantageous, for example, to provide a topcoat that is compatible with immersion fluids having a refractive index of greater than about 1.6.

According to an aspect of the invention, there is provided a device manufacturing method, comprising:

projecting a patterned beam of radiation through a liquid onto a resist provided on a substrate, wherein a topcoat layer is provided between the resist and the liquid, the topcoat layer having a thickness that is less than or equal to about five times the wavelength of the radiation of the patterned beam, the liquid has a thickness that is greater than or equal to about five times the wavelength of the radiation of the patterned beam, and the liquid, the topcoat and the resist have respectively, first, second and third refractive indices, the first refractive index being less than or equal to the second refractive index and the second refractive index being less than or equal to the third refractive index.

According to another aspect of the invention, there is provided a device manufacturing method, comprising:

projecting a patterned beam of radiation through a liquid onto a resist provided on a substrate, wherein a topcoat layer is provided between the resist and the liquid, the topcoat has a thickness substantially equal to $$\frac{\left(m - \frac{1}{2}\right)\lambda}{2 \cdot n_{tc} \cdot (1 - \sin^2\beta)}, \text{ wherein } \sin\beta = NA \cdot \frac{n_l}{n_r}, m = 1, 2, 3, \text{ etc.,}$$

$\lambda$ is the wavelength of the radiation of the patterned beam, NA is the numerical aperture at the substrate, $n_l$ is the refractive index of the liquid, $n_{tc}$ is the refractive index of the topcoat, and $n_r$ is the refractive index of the resist;

the liquid has a thickness that is greater than or equal to about five times $\lambda$, the resist has a thickness in the range of from half to one times $\lambda$, and $n_l$ is less than or equal to $n_{tc}$, $n_{tc}$ is less than or equal to $n_r$, and $n_{tc}$ is about equal to the square root of the product of $n_l$ and $n_r$.

According to another aspect of the invention, there is provided a device manufacturing method, comprising:

projecting a patterned beam of radiation through a liquid onto a resist provided on a substrate, wherein a topcoat layer is provided between the resist and the liquid, the topcoat comprising a suspension of nano-particles.

According to an aspect of the invention, there is provided a device manufacturing method, comprising:

projecting a patterned beam of radiation through a liquid onto a resist provided on a substrate, wherein a topcoat layer is provided between the resist and the liquid and a primer layer is provided between the resist and the topcoat, the primer layer having a thickness less than the wavelength of the radiation of the patterned beam.

According to an aspect of the invention, there is provided a substrate, comprising:

a surface substantially covered by a resist that can be exposed by radiation; and a topcoat layer substantially covering the resist, the topcoat layer having a thickness less than or equal to about five times the wavelength of the radiation, wherein the topcoat and the resist have respectively, first and second refractive indices, the first refractive index being less than or equal to the second refractive index.

According to an aspect of the invention, there is provided a substrate, comprising:

a surface substantially covered by a resist that can be exposed by radiation;

a topcoat layer substantially covering the resist; and a primer layer provided between the resist and the topcoat layer, the primer layer having a thickness less than the wavelength of the radiation.

According to another aspect of the invention, there is provided a substrate, comprising:

a surface substantially covered by a resist that can be exposed by radiation, the resist having a thickness in the range of from half to one times the wavelength; and a topcoat layer substantially covering the resist, the topcoat layer having a thickness of about one quarter of the wavelength, wherein the topcoat and the resist have respectively, first and second refractive indices, the first refractive index being less than or equal to the second refractive index.

According to another aspect of the invention, there is provided a substrate, comprising:

a surface substantially covered by a resist that can be exposed by radiation; and a topcoat layer substantially covering the resist, the topcoat comprising a suspension of nano-particles.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
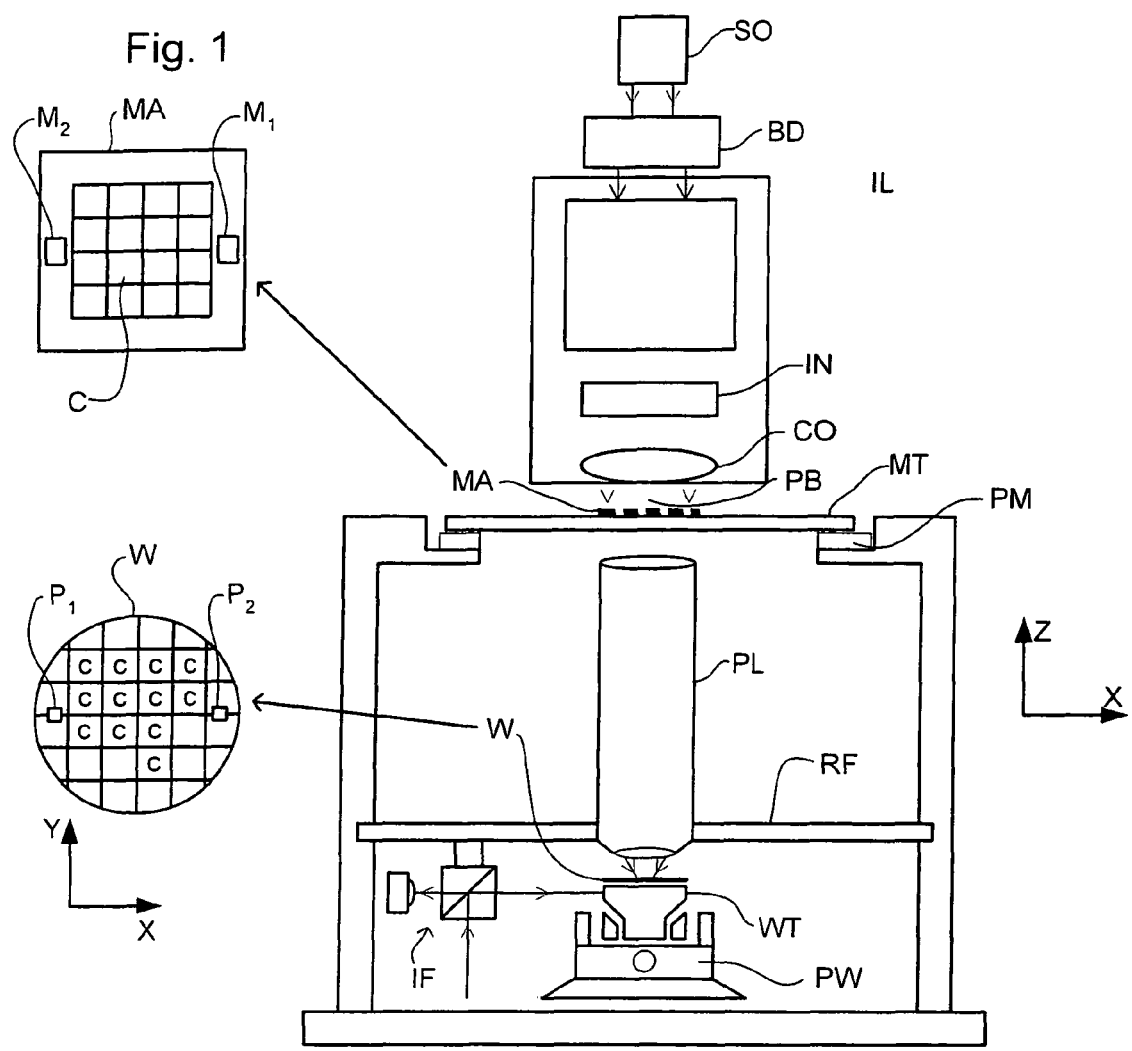
FIG. 1 depicts a lithographic apparatus according to an embodiment of the invention.
Figure 2:
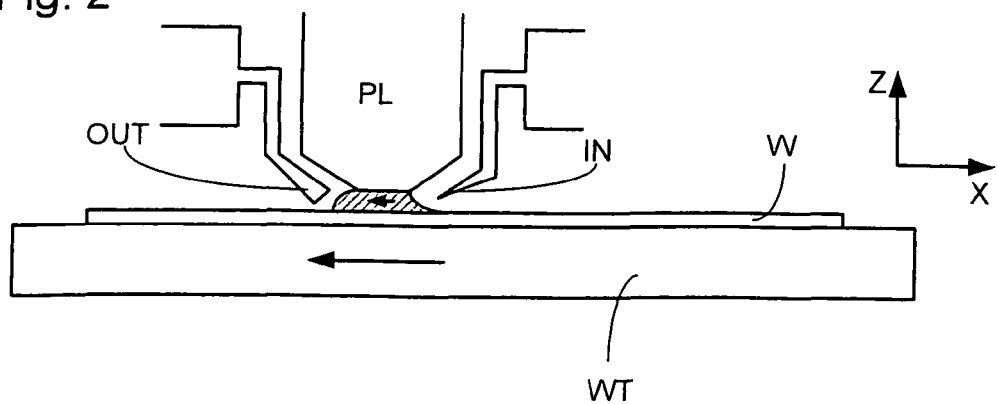
FIGS. 2 and 3 depict a liquid supply system for use in a lithographic projection apparatus.
Figure 3:
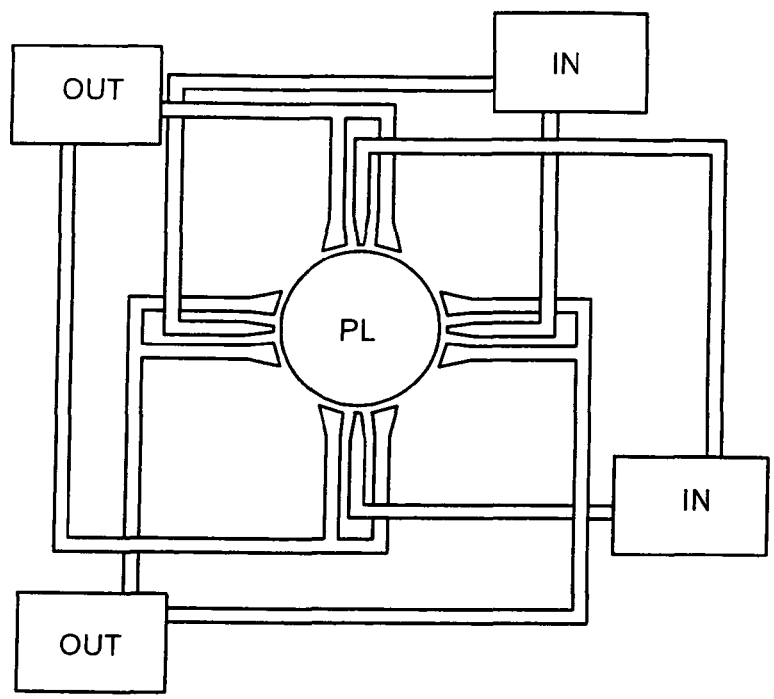

FIG. 1 schematically depicts a lithographic apparatus according to one embodiment of the invention. The apparatus comprises:

an illumination system (illuminator) IL configured to condition a radiation beam PB (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. Having traversed the patterning device MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
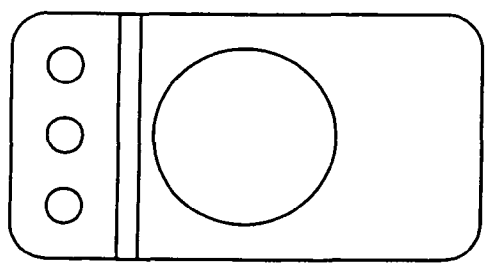
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

Figure 5:
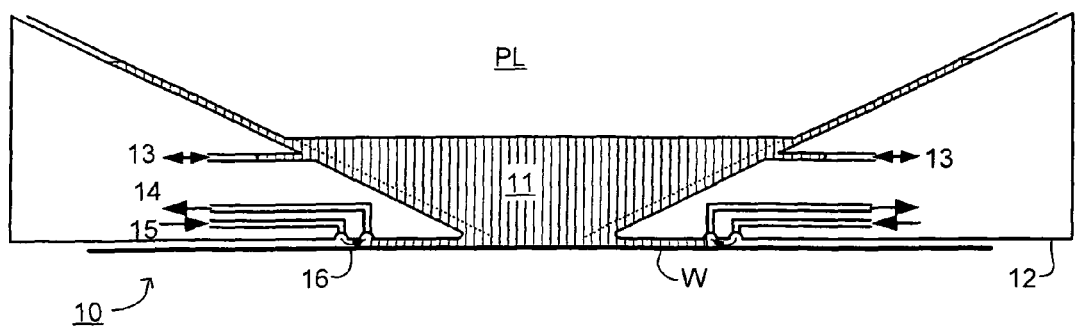
FIG. 5 depicts a liquid supply system for use in an embodiment of the invention.

FIG. 5 shows a liquid supply system comprising a liquid confinement structure (sometimes referred to as an immersion hood or showerhead) according to an embodiment of the invention. In particular, FIG. 5 depicts an arrangement of a reservoir 10, which forms a contactless seal to the substrate around the image field of the projection system so that liquid is confined to fill a space between the substrate surface and the final element of the projection system. A liquid confinement structure 12 positioned below and surrounding the final element of the projection system PL forms the reservoir. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. It will be understood by the person skilled in the art that other types of seal could be used to contain the liquid such as simply an outlet to remove liquid and/or gas.

Figure 6:
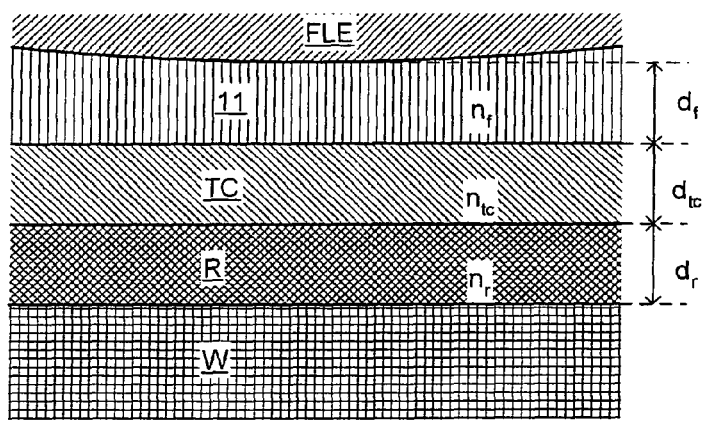
FIG. 6 depicts different media through which a patterned beam passes near the substrate in an embodiment of the invention.

FIG. 6 shows the different media through which the patterned beam of radiation will pass according to an embodiment of the invention. After leaving the final element FLE (although this element is shown as convex, it may be of other shapes) of the projection system PL, the patterned beam passes through the immersion liquid 11, a topcoat TC, and into the resist R, which is provided on the substrate W, e.g. by spin coating. Between the resist R and substrate W, an anti-reflection coating (e.g., a bottom antireflective coating (BARC)) may be provided. The resist R is exposed by the patterned beam and hence is arranged to be sensitive to radiation of the patterned beam, which has a wavelength λ, e.g., 193 nm. Immersion liquid 11 has a refractive index $n_l$>1.6 and is provided to improve the depth of focus and/or resolution of the image projected onto the substrate. Topcoat TC is provided (i) to prevent chemical and/or physical interaction between the immersion fluid 11 and resist R and/or (ii) to keep particulate contaminants and/or nano-particles suspended in the immersion fluid to increase its refractive index, away from the resist R.

The final element FLE of the projection system may be made of $SiO_2$, $CaF_2$, $BaF_2$, $Al_2O_3$ or a mixture of these and other crystals and so its refractive index $n_{fle}$ at 193 nm is 1.5 or higher. Therefore, to avoid internal reflection in the final element FLE, immersion liquid 11 and topcoat TC, the thicknesses, $d_l$, $d_{tc}$ and $d_r$, and refractive indices, $n_l$, $n_{tc}$ and $n_r$, of the immersion liquid 11, topcoat TC and resist R meet the following criteria:

$$n_{fle} \leq n_l \leq n_{tc} \leq n_r \qquad (1)$$

$$d_l \gtrsim 5 \cdot \lambda \qquad (2)$$

$$d_{tc} \lesssim 5 \cdot \lambda \qquad (3)$$

Liquids that can be used as the immersion liquid include: suspensions of dielectric nano-particles, e.g., alumina; solutions of acids such as sulfuric acid or phosphoric acid; and solutions of certain salts such as $Ce_2SO_4$. Therefore, it would be desirable that the topcoat should resist chemical attack from the immersion fluid, especially if the immersion fluid contains sulfuric acid, while not reacting with the resist and being immiscible in the resist. It would also be desirable that the topcoat has physical properties enabling it to be dispensed by a spin coater and remain in a layer of stable thickness as the coated substrate is loaded into the lithographic apparatus. It would also be desirable that the topcoat is soluble in resist developer as that should avoid a separate step to remove the topcoat when processing the substrate. Water based topcoats, such as TSP3A, TILC-016 and TILC-019 supplied by Tokyo Ohka Kogyo Co., Ltd., and Teflon based topcoats may be used. If necessary, the refractive index of the topcoat may be increased by adding dielectric nano-particles, having dimensions smaller than the wavelength of the patterned beam, in suspension. The refractive index of the topcoat is then a volume average of the refractive index of the particles and the liquid in which they are suspended. In an embodiment, the dielectric nano-particles have dimensions in the range of from 10 to 20 nm. They can be manufactured chemically and encapsulated, e.g. with polar molecules, to prevent agglomeration into larger particles.

Figure 7:
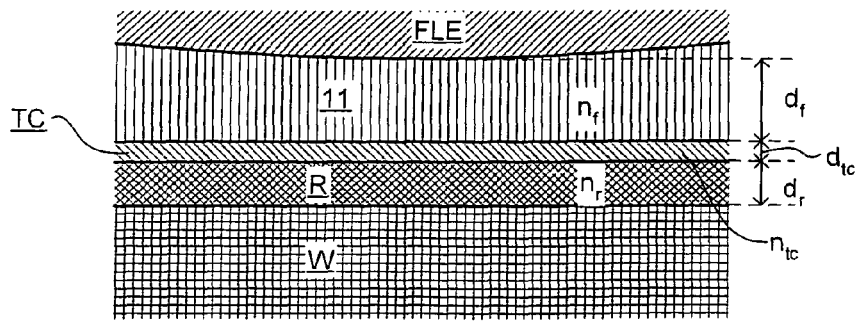
FIG. 7 depicts the different media through which a patterned beam passes near the substrate in another embodiment of the invention.

Referring to FIG. 7, in another embodiment of the invention, a thin topcoat with a thickness and refractive index optimized for transmission is used. The following criteria apply, using the same symbols as previously noted:

$$n_l \leq n_{tc} \leq n_r \qquad (4)$$

$$d_l \lesssim 5 \cdot \lambda \qquad (5)$$

$$\tfrac{1}{2} \cdot \lambda \leq d_r \leq \lambda \qquad (6)$$

The refractive index of the topcoat should further be made as close as possible to the square root of the product of the refractive indices of the immersion liquid and the resist. A variance of 10% may be permissible. In other words:

$$n_{tc} = \sqrt{n_l \cdot n_r} \pm 10\% \qquad (7)$$

An optimum thickness $d_{tc}$ of the topcoat then depends on the numerical aperture, NA, at the substrate and is given by:

$$2 \cdot n_{tc} \cdot d_{tc} \cdot (1 - \sin^2 \beta) = \left(m - \tfrac{1}{2}\right)\lambda \text{ where} \qquad (8)$$

-continued $$\sin\beta = NA \cdot \frac{n_l}{n_r} \text{ and } m = 1, 2, 3, \text{ etc.} \quad (9)$$

Again, a variance of 10% may be permissible.

Figure 8:
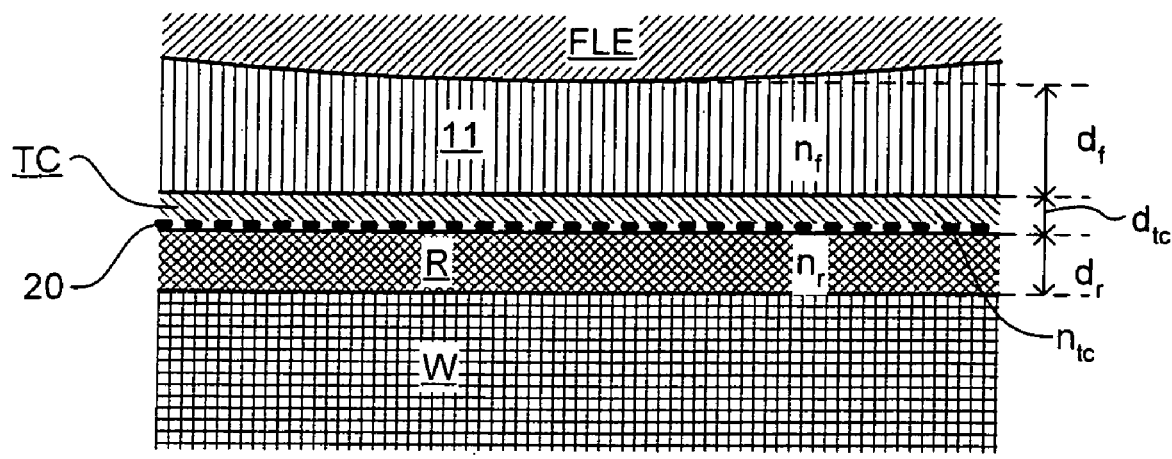
FIG. 8 depicts the different media through which a patterned beam passes near the substrate in yet another embodiment of the invention.

FIG. 8 is a view, similar to FIG. 7, of different media through which the patterned beam of radiation will pass according to another embodiment of the invention. This embodiment is the same as the embodiment(s) described in relation to FIG. 6 and FIG. 7 except that a primer layer 20 is provided between the resist R and topcoat TC. The primer layer 20 is intended to promote adhesion, e.g., by matching surface characteristics, between the resist R and the topcoat TC and its exact composition will depend on the materials used as the resist and topcoat. The primer layer may also prevent or reduce diffusion between the topcoat and the resist layer in either direction. The primer layer 20 should be as thin as possible, and, in an embodiment, much thinner than the wavelength of the exposure radiation so as to minimize its effect on imaging.

Where layer thicknesses are defined in terms of the wavelength of radiation of the patterned beam, the wavelength is to be taken as the wavelength in the respective medium.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, such as those types mentioned above, and whether the immersion liquid is provided in the form of a bath or only on a localized surface area of the substrate. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A substrate, comprising:
   a surface substantially covered by a resist which is sensitive to radiation having a wavelength; and
   a topcoat layer substantially covering the resist, the topcoat layer having a thickness less than or equal to about five times the wavelength of the radiation,
   wherein the topcoat and the resist have respectively, first and second refractive indices, the first refractive index being less than or equal to the second refractive index.

2. The substrate according to claim 1, wherein the topcoat comprises a suspension of dielectric nano-particles having dimensions less than the wavelength of the radiation.

3. The substrate according to claim 2, wherein the nano-particles have dimensions in the range of about 10 to 20 nanometers.

4. The substrate according to claim 1, wherein the topcoat has a refractive index of greater than or equal to about 1.6.

5. The substrate according to claim 1 wherein the topcoat has a refractive index of greater than or equal to about 1.7.

6. The substrate according to claim 1, wherein the topcoat comprises a suspension of nano-particles.

7. A substrate, comprising:
   a surface substantially covered by a resist which is sensitive to radiation having a wavelength;
   a topcoat layer substantially covering the resist; and
   a primer layer provided between the resist and the topcoat layer, the primer layer having a thickness less than the wavelength of the radiation.

8. The substrate according to claim 7, wherein the primer layer promotes adhesion of the topcoat to the resist.

9. The substrate according to claim 7, wherein the topcoat comprises a suspension of nano-particles.

10. The substrate according to claim 7, wherein the resist has a refractive index greater than or equal to a refractive index of the topcoat.

11. The substrate according to claim 7, wherein the topcoat layer has a thickness that is less than or equal to about five times the wavelength of the radiation.

12. The substrate according to claim 1, wherein the topcoat has a thickness substantially equal to $$\frac{\left(m-\frac{1}{2}\right)\lambda}{2\cdot n_{tc}\cdot(1-\sin^2\beta)}, \text{ wherein } \sin\beta = NA\cdot\frac{n_l}{n_r}, m = 1, 2, 3, \text{ etc.,}$$

$\lambda$ is the wavelength of the radiation, NA is the numerical aperture at the substrate associated with the radiation, $n_l$ is the refractive index of liquid to be applied on the top coat, $n_{tc}$ is the refractive index of the topcoat, and $n_r$ is the refractive index of the resist, the resist has a thickness in the range of from half to one times $\lambda$, and $n_l$ is less than or equal to $n_{tc}$, $n_{tc}$ is less than or equal to $n_r$, and $n_{tc}$ is about equal to the square root of the product of $n_l$ and $n_r$.

13. The substrate according to claim 1, further comprising a primer layer provided between the resist and the topcoat layer, the primer layer having a thickness less than the wavelength of the radiation.

14. A substrate, comprising:
 a surface substantially covered by a resist which is sensitive to radiation having a wavelength of about 365 nm or less; and
 a topcoat layer substantially covering the resist, the topcoat comprising a suspension of nano-particles having dimensions less than the wavelength of the radiation.

15. The substrate according to claim 14, wherein the nano-particles have dimensions in the range of about 10 to 20 nanometers.

16. The substrate according to claim 14, wherein the topcoat has a refractive index of greater than or equal to about 1.6.

17. The substrate according to claim 14, wherein the topcoat has a refractive index of greater than or equal to about 1.7.

18. The substrate according to claim 14, wherein the suspension of particles comprises a suspension of dielectric nano-particles.

19. The substrate according to claim 14, further comprising a primer layer provided between the resist and the topcoat layer, the primer layer having a thickness less than the wavelength of the radiation.

* * * * *

UNITED STATES PATENT AND TRADEMARK OFFICE
CERTIFICATE OF CORRECTION

PATENT NO. : 7,763,355 B2  Page 1 of 1
APPLICATION NO. : 12/292031
DATED : July 27, 2010
INVENTOR(S) : Mulkens et al.

It is certified that error appears in the above-identified patent and that said Letters Patent is hereby corrected as shown below:

Column 1, first paragraph, is amended to read:

The present application is a divisional of U.S. patent application Ser. No. 11/022,935, filed Dec. 28, 2004, now U.S. Pat. No. 7,491,661, ~~now allowed,~~ the entire contents of the foregoing application herein fully incorporated by reference.

Signed and Sealed this

Second Day of November, 2010

David J. Kappos
*Director of the United States Patent and Trademark Office*